[12] United States Patent
Waugh et al.

(10) Patent No.: US 10,754,743 B2
(45) Date of Patent: Aug. 25, 2020

(54) APPARATUS AND METHOD USING DEBUG STATUS STORAGE ELEMENT

(71) Applicant: Arm Limited, Cambridge (GB)

(72) Inventors: Alex James Waugh, Cambridge (GB); Pedro López Muñoz, Cambridge (GB); Peng Wang, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/221,785

(22) Filed: Dec. 17, 2018

(65) Prior Publication Data
US 2020/0192774 A1 Jun. 18, 2020

(51) Int. Cl.
*G06F 11/22* (2006.01)
*G06F 11/36* (2006.01)
*G01R 31/317* (2006.01)
*G06F 16/903* (2019.01)
*G06F 11/30* (2006.01)
*G06F 11/26* (2006.01)

(52) U.S. Cl.
CPC .... *G06F 11/2236* (2013.01); *G01R 31/31705* (2013.01); *G06F 11/26* (2013.01); *G06F 11/3072* (2013.01); *G06F 16/903* (2019.01)

(58) Field of Classification Search
CPC ............. G06F 11/2236; G06F 11/3648; G06F 11/3656
See application file for complete search history.

(56) References Cited

U.S. PATENT DOCUMENTS

| 2008/0184055 A1* | 7/2008 | Moyer | G06F 11/0721 713/502 |
| 2013/0090887 A1* | 4/2013 | Deogharia | G01R 31/318555 702/120 |
| 2014/0053036 A1* | 2/2014 | Nixon | G01R 31/31705 714/734 |
| 2014/0181495 A1* | 6/2014 | Jang | G06F 11/2284 713/2 |
| 2016/0139201 A1* | 5/2016 | Lin | G01R 31/3177 714/727 |
| 2017/0322867 A1* | 11/2017 | Jiao | G06F 11/3624 |
| 2019/0347213 A1* | 11/2019 | Lutz | G06F 21/78 |

* cited by examiner

*Primary Examiner* — Jacob Petranek
(74) *Attorney, Agent, or Firm* — Nixon & Vanderhye P.C.

(57) ABSTRACT

At least one processor core has debug and non-debug modes of operation. Debug control circuitry controls operation of the at least one processor core when in the debug mode. On power up of a given processor core, the core checks a debug status value stored in a debug status storage element. When the debug status value has a first value, a debug connect sequence of messages is exchanged with the debug control circuitry over a debug interface to determine whether the given processor core should operate in the debug mode or the non-debug mode, and the debug status value is set to a second value when it is determined that the given processor core should operate in the non-debug mode. When the debug status value has the second value, the given processor core omits initiating the debug connect sequence and determines that it should operate in the non-debug mode.

20 Claims, 4 Drawing Sheets

APPARATUS AND METHOD USING DEBUG STATUS STORAGE ELEMENT

BACKGROUND

Technical Field

The present technique relates to the field of data processing.

Technical Background

A processor core may support a debug mode of operation in which operation of the processor core may be controlled by debug control circuitry while the processor core is operating in the debug mode. This can be useful when developing software for a particular device. The debug mode may allow potential errors in software code to be identified by investigating the behaviour of the processor core when executing the code.

SUMMARY

At least some examples provide an apparatus comprising: at least one processor core having a debug mode of operation and a non-debug mode of operation; debug control circuitry to control operation of the at least one processor core when the at least one processor core is operating in the debug mode; a debug interface to exchange messages between the debug control circuitry and the at least one processor core; and a debug status storage element to store a debug status value, in which: on power up of a given processor core, the given processor core is configured to check the debug status value stored in the debug status storage element; when the debug status value has a first value, the given processor core is configured to initiate a debug connect sequence of messages exchanged with the debug control circuitry over the debug interface to: determine whether the given processor core should operate in the debug mode or the non-debug mode, and trigger setting of the debug status value in the debug status storage element to a second value when it is determined that the given processor core should operate in the non-debug mode; and when the debug status value has the second value, the given processor core is configured to omit initiating the debug connect sequence and determine that the given processor core should operate in the non-debug mode.

At least some examples provide a system comprising the apparatus described above and an external debugger to control operation of the debug control circuitry.

At least some examples provide an apparatus comprising: at least one means for data processing having a debug mode of operation and a non-debug mode of operation; means for controlling operation of the at least one means for data processing when the at least one processor core is operating in the debug mode; means for exchanging messages between the means for controlling and the at least one means for data processing; and means for storing a debug status value, in which: on power up of a given means for data processing, the given means for data processing is configured to check the debug status value stored in the means for storing; when the debug status value has a first value, the given means for data processing is configured to initiate a debug connect sequence of messages exchanged with the means for controlling over the means for exchanging messages to: determine whether the given means for data processing should operate in the debug mode or the non-debug mode, and trigger setting of the debug status value in the means for storing to a second value when it is determined that the given means for data processing should operate in the non-debug mode; and when the debug status value has the second value, the given means for data processing is configured to omit initiating the debug connect sequence and determine that the given means for data processing should operate in the non-debug mode.

At least some examples provide a data processing method for an apparatus comprising at least one processor core having a debug mode of operation and a non-debug mode of operation, debug control circuitry to control operation of the at least one processor core when the at least one processor core is operating in the debug mode, and a debug interface to exchange messages between the debug control circuitry and the at least one processor core; the method comprising: on power up of a given processor core, the given processor core checking a debug status value stored in a debug status storage element; when the debug status value has a first value, the given processor core initiating a debug connect sequence of messages exchanged with the debug control circuitry over the debug interface to: determine whether the given processor core should operate in the debug mode or the non-debug mode, and trigger setting the debug status value in the debug status storage element to a second value when it is determined that the given processor core should operate in the non-debug mode; and when the debug status value has the second value, the given processor core omitting initiating the debug connect sequence, and determining that the given processor core should operate in the non-debug mode.

Further aspects, features and advantages of the present technique will be apparent from the following description of examples, which is to be read in conjunction with the accompanying drawings.

DESCRIPTION OF EXAMPLES

Figure 1:
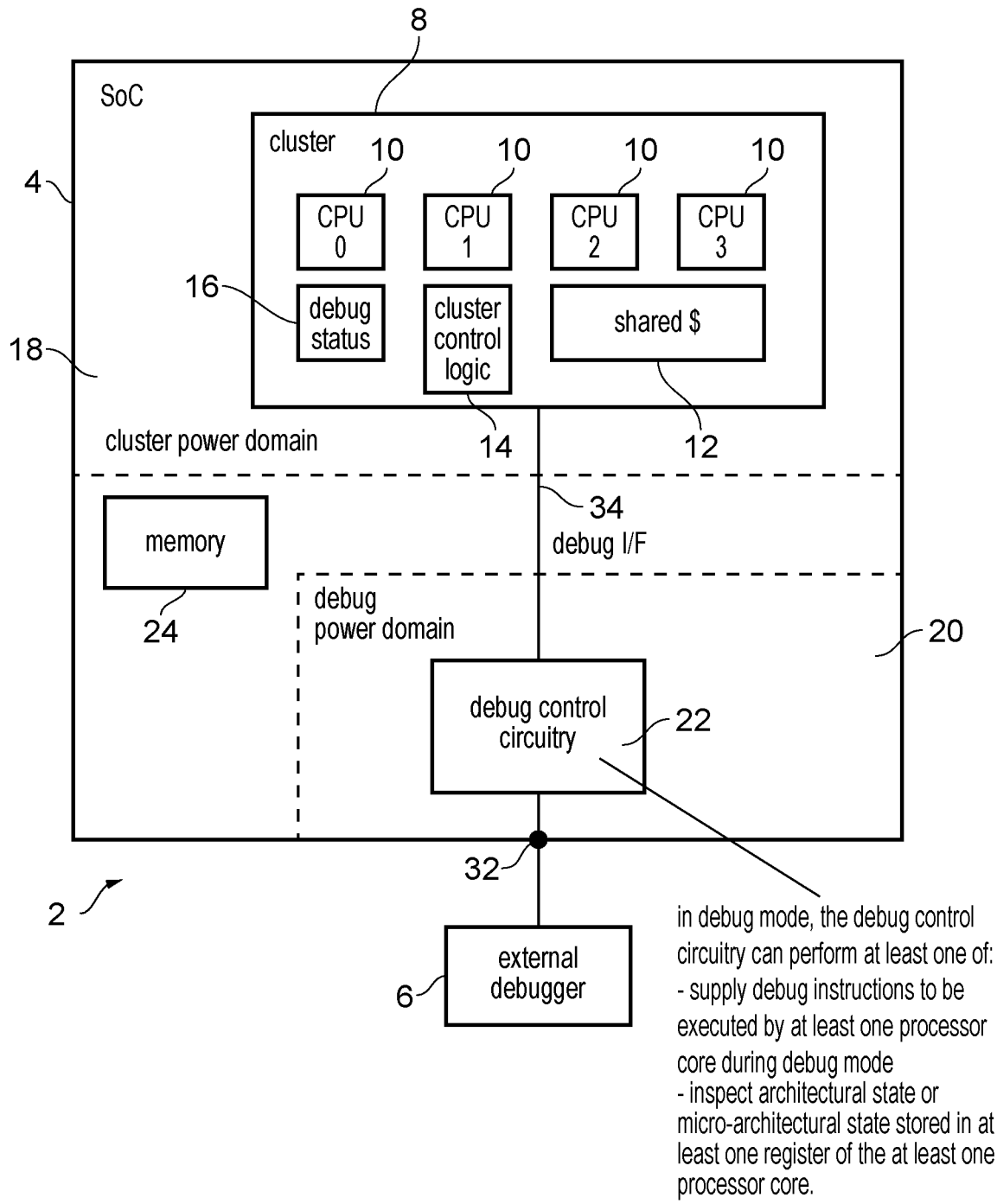
FIG. 1 shows an example of a data processing apparatus having debug control circuitry.

The data processing apparatus may have at least one processor core having a debug mode of operation and a non-debug mode of operation. In the non-debug mode of operation, operation of the at least one processor core may be controlled based on program instructions fetched from memory or an instruction cache. On the other hand, in the debug mode of operation, operation of the at least one processor core may be controlled by debug control circuitry provided within the apparatus. For example the debug control circuitry may be an on-chip control logic block, which can be used by an external debugger to inject additional instructions to be executed by the processor core at a given point of the program being executed, or to inspect the contents of registers within the processor core. Such a debug mode may be useful for diagnosing problems in code being executed at a particular data processing apparatus, which can help with software development.

The debug control circuitry and the at least one processor core may exchange messages over a debug interface. When a given processor core is powered up, the given processor core may need to check whether it should operate in the debug mode or the non-debug mode, by initiating a debug connect sequence of messages exchanged with the debug control circuitry over the debug interface. Completing the debug connect sequence may require a significant number of processing cycles, because in some systems the debug control circuitry may be located a relatively long distance away from the processor core on a system on-chip and so the debug interface may correspond to a relatively long communication path. Hence, even in cases when the debug connect sequence determines that the debug mode is not needed, completing the debug connect sequence may still have a significant impact on the boot time performance on the processor core. This can be a particular problem in systems where cores may be powered up and powered down a considerable number of times, for example to save power when there are periods of lower processing load. Even if debug mode is only used for an initial period of software development but not needed once the device is used in the hands of the end user, the extra delay associated with the debug connect sequence may cause slow boot times for the user even after debug mode is no longer required.

One approach for eliminating the need to perform the debug connect sequence could be to provide an external input pin to the system-on-chip, which can be wired when building a processing device to provide a direct input into the chip to signal whether an external debugger has been provided. When an external debugger is not present then the core could detect from the signal on the input pin that there is no need to enter debug mode and could omit performing the debug connect sequence to improve performance when booting up a processor core. However, this would require extra circuit area to support the pin. On some chips the space available for externally accessible pins may be relatively restricted so that it may not be practical to provide a dedicated pin for indicating whether the external debugger is present. Also, this approach would require the pin to be exposed to the overall system designer and user, and the specification of use of this pin may not follow any standard, so system integrators may have to determine how to wire up the pin so it is derived accurately depending on the presence of the external debugger. In some systems this may not be straightforward and so some system integrators may prefer to simply to tie the pin to a fixed value indicating that the external debugger is present so that it is not possible for the processor core to take any advantage from that externally exposed pin.

In the approach discussed below, a debug status storage element is provided for storing a debug status value which can be used to check whether, on powering up a given processor core, the debug connect sequence should be performed. On power up of a given processor core, the given processor core checks the debug status value stored in the debug storage element. When the debug status value has a first value, the given processor core initiates a debug connect sequence of messages exchanged with the debug control circuitry over the debug interface, to determine whether the given processor core should operate in the debug mode or the non-debug mode. When it is determined that the given processor core should operate in the non-debug mode, the debug status value is set to a second value. On the other hand, if on power up of a given processor core the debug status value has the second value already, then the given processor core may omit initiating the debug connect sequence and determine that the given processor core should operate in the non-debug mode. Hence, by omitting the debug connect sequence when a core was previously identified as needing to operate in the non-debug mode following powering up, this can reduce boot time by eliminating a potentially lengthy sequence of messages over a relatively slow interface. This approach does not require any specific externally exposed pin to be provided on the chip, as the detection of whether the debug connect sequence is required is based on previous messages exchanged on the same debug interface used to perform the debug connect sequence. Effectively the debug status value in the debug status storage element acts as a cache of the determination of which mode a processor core should operate in, as determined on a previous instance of powering up a processor core.

The processor core has a debug mode and a non-debug mode. It will be appreciated that in some systems there may be a number of variants of non-debug mode with different properties. Hence, references to non-debug mode may encompass any of two or more different non-debug modes of operation. Similarly, debug mode could be any of one, two or more variants of debug mode.

The debug status storage element may be capable of remaining powered up even when each of the at least one processor core is in a power saving state. This enables the debug status value to be retained even when all of the processor cores are powered down, so that when one of the at least one processor core is powered up again the previous determination of whether a processor core should operate in debug or non-debug mode can still be remembered to enable the debug connect sequence to be omitted to improve performance.

The debug status storage element can be useful in a system that only comprises a single processor core.

However, in other examples the apparatus may include a cluster of at least two processor cores each having a debug mode operation and non-debug operation.

Although in a multi-core system, it would be possible to provide separate status debug elements for each core, in practice often either the whole cluster should operate in debug mode or the whole cluster should operate in non-debug mode. The debug status storage element may be shared between the at least two processor cores of the cluster. This enables one core to learn which mode was determined by another core performing the debug connect sequence so that the second core does not need to perform the debug connect sequence itself. Hence, when a second processor core of a cluster is powered up after a first processor core of the cluster has already initiated the debug connect sequence, the second processor core may omit initiating the debug connect sequence when the debug connect sequence initiated by the first processor core triggered setting the debug status value to a second value. Hence, in multi-core systems the debug status storage element can be particularly useful since the debug connect sequence can be performed the first time any of the cluster of cores is powered up, and after that the remaining cores can reuse the mode determination already carried out by the first cores to save power and improve boot time performance.

The cluster of processor cores may have cluster control circuitry associated with it, where the cluster control circuitry is capable of being powered up even when each of the two or more processor cores of the cluster are all in a power saving state. For example the cluster control circuitry could be in a region of the chip that remains powered, e.g. so that shared caches or other storage elements can be provided to store data which should be retained even when all of the cores are powered down. In such an example, on power up of the cluster control circuitry, the cluster control circuitry may initiate a debug query sequence of messages exchanged with the debug control circuitry over the debug interface to determine whether the cluster should operate in the debug mode or non-debug mode, and trigger setting of the debug status value in the data debug storage element to a second value when it is determined that the clusters should operate in the non-debug mode. The debug query sequence could be substantially the same as the debug connect sequence which a given processor core may perform on power up, or could be different (for example some aspects of the debug connect sequence such as programming of some debug registers within the processor core may not be able to be performed by the cluster control circuitry, as some processor cores may not be powered up yet, so could be omitted form the debug query sequence). By enabling the cluster control circuitry to initiate the debug query sequence, this means the messaging to check whether to operate in debug mode can be initiated before any of the processor cores have been powered up. This provides a further performance boost because even on the first time that a given processor core is powered up when none of the other cores in the cluster have been powered up yet, the first powered up core can already benefit from the caching of the debug status within the debug status storage element, so it may be that none of the cores need to execute the debug connect sequence in cases where the cluster control circuitry has already been carried out the debug query sequence and determined that cluster should operate in the non-debug mode. Hence, this reduces latency on power up of the first core of the cluster.

On the switch from non-debug mode to debug mode, the debug control circuitry may issue a status update message over the debug interface, to trigger the debug status value in the debug status storage element to be set to the first value. Again, the same debug interface which is used for other messages between the debug control circuitry and the at least one processor core can be used for resending the status update message. By sending the status update message, then this ensures that if any other processor core powers up after the update, then they will detect from the first value of the debug status value that the debug connect sequence is required.

When the debug status storage element is reset or powered up after previously being in a power saving state, the debug status storage element may set the debug status value to the first value by default. This ensures that the next time a processor core or the cluster control circuitry is powered up then it will detect that the debug connect sequence or debug query sequence may be required and will then check which of the debug and non-debug modes is needed.

In the debug mode, the debug control circuitry may perform a number of actions for diagnostic purposes, such as the supply of debug instructions to be executed by the at least one processor core during the debug mode (these instructions may be executed instead of the normal instructions fetched from an instruction cache or memory corresponding to the program being executed prior to entry to debug mode), and/or inspection of architectural state or micro-architectural state stored in at least one register of the at least one processor core. For example the debug control circuitry may, under control of an external debugger, issue signals for requesting the return of the current values in certain registers of the processor core, which can then be output to the outside to enable the external debugger to identify whether the program is functioning correctly.

The debug connect sequence may include further steps other than determining whether the processor core should operate in the debug or non-debug mode. For example the processor core may have at least one debug control register to store at least one debug control value which is programmable by the debug control circuitry, and in the debug connect sequence, the debug control circuitry may send at least one message for programming a debug control value in at least one debug control register of the given processor core. For example, the debug control registers could include at least one breakpoint register for storing at least one breakpoint address, and/or at least one watchpoint register to store at one watchpoint address. The breakpoint address may define an instruction address at which, when program flow reaches that instruction address, the given processor core should switch to the debug mode from the non-debug mode. The watchpoint address may define a data address for which, when the given processor core initiates a data access targeting the address specified as a watchpoint address, the processor core then switches to the debug mode. Defining such breakpoints and watchpoints can be useful for the external debugger to trigger certain diagnostic actions when program execution reaches a given point or when a given event of interest happens. Hence, part of the debug connect sequence may be the programming of the breakpoint/or watchpoint registers with the relevant addresses of interest. Similarly, the programming of other debug control registers could be performed as part of the debug connect sequence.

In some examples, when the debug connect sequence is initiated for a given processor core, the debug status storage element may cache at least a subset of the at least one debug control value provided by the debug control circuitry for programming to the at least one debug control register at the given processor core. This allows the messages for programming the cached debug control values to be omitted on a subsequent instance of powering up the core, if the values to be programmed to the debug register can be determined from the cached subset of debug control values. Hence, when checking the debug status value determined that the debug status value has the second value and the debug status storage element stores at least one cached debug value, the given processor core may program at least a subset of its debug control registers based on the at least one cached debug control value stored in the debug status storage element, to avoid the need to obtain these values from the debug control circuitry again. This can reduce the start up latency for the processor core.

In some cases the subset of the at least one debug control value cached in the debug status storage element may be all of the debug control values which were provided by the debug control circuitry. However, in practice some implementations may provide only a limited amount of storage capacity within the debug status storage element and there may not be room for all of the debug control values which would be provided when the debug connect sequence is performed in full. This may not be a problem as, for example, one approach could be that if there is only space for a single breakpoint or watchpoint address in the debug status storage element, then the external debugger could control the on-chip debug control circuitry to supply a breakpoint or watchpoint address which is expected to be reached relatively early during the execution of the program code to be debugged. In this case, when program flow or a data access is detected as reaching the specified breakpoint or watchpoint address, this may then trigger the core to switch to debug mode, and then the programming of any remaining breakpoints or watchpoints or other debug control information could then be performed by the debug control circuitry at the time of responding to the first breakpoint or watchpoint rather than being done at the time of powering up the core.

In some examples, the debug control circuitry may operate in a different power domain to the at least one processor core. Hence the debug control circuitry may have its power up and power down events controlled independently from those in the at least one processor core, so that is possible for the debug control circuitry to remain powered when the at least one processor core are powered down, or vice versa.

The debug control circuitry may in some examples operate under the control of an external debugger external to the apparatus. For example the external debugger may communicate with the debug control circuitry over an input/output pin provided at the boundary of the system on-chip comprising the debug control circuitry and the at least one processor core.

FIG. 1 illustrates an example of system 2 comprising a data processing apparatus (e.g. a system on-chip) 4 and an external debugger 6. The system on-chip 4 includes a cluster 8 of processor cores 10 (in this example four processor cores, although other numbers could also be provided). The cluster 8 includes a shared cache 12 for caching data for access by any of the cluster of processor cores 10, and cluster control logic 14 for controlling operation of the cluster. For example the cluster control logic 14 may control operations for determining how many of the cores 10 should be powered up at a given time, or could control allocation of work loads to the cores. The cluster 8 also includes a debug status storage element (e.g. one or more registers) 16 which will be discussed in more detail below. The cluster is provided within a cluster power domain 18.

A separate debug power domain 20 is provided, including debug control circuitry 22 for controlling operation of the cluster 8 when the cores 10 in the cluster are operating in a debug mode. The debug power domain is independently controllable from the cluster power domain 18 so that the debug power domain could be powered up when the cluster power domain is powered down or vice versa.

The system on chip 4 may also include on-chip memory 24 which may also be in a separate power domain from the cluster domain 18 and the debug domain 20 or could be in the same domain as one or other of these power domains. The on-chip memory could for example comprise dynamic random access memory (DRAM) or other types of memory technology.

Figure 2:
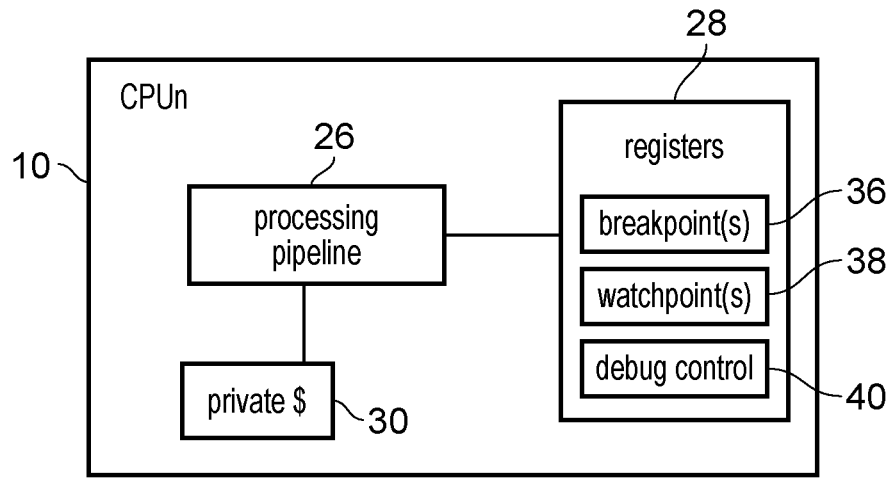
FIG. 2 shows an example of components of a processor core within the apparatus of FIG. 1.

FIG. 2 shows in more detail components of an individual processor core 10 within the cluster 8. The core 10 includes a processing pipeline 26 for processing instructions to carry out data processing operations, registers 28 for storing operands for processing by the pipeline and to which results of executed processing operations could be written, and a private cache 30 for caching a subset of data from memory 24 for faster access by that individual core. Unlike the shared cache 12 the private cache 30 is accessible to only one of the cores. The processing pipeline 26 may include a number of pipeline stages, such as a fetch stage for fetching program instructions from the private cache 30, shared cache 12, or memory 24; a decode stage for decoding the fetched instructions to identify which processing operations are to be performed and generating control signals for triggering execution units to carry out those operations; and an execute stage for executing the required operations in response to the control signals generated by the decode stage. It will be appreciated that a range of different pipeline designs could be used for the processor cores, and that not all the cores 10 need to have exactly the same microarchitecture for the pipeline 26. For example, some systems may have an asymmetric set of cores 10 provided in the cluster, for example combining a higher performance, (but more power intensive) core with a less power-hungry core which may offer lower performance at increased energy efficiency.

Each of the cores 10 may support a debug mode and at least one variant of a non-debug mode. In the non-debug mode the processor core executes instructions fetched from an instruction cache, shared cache or memory, where those instructions are the instructions of the relevant program code being executed by the core 10. However, in the debug mode, the operation of the core 10 can be controlled by the debug control circuitry 22, which is itself controlled by the external debugger 6. For example, the debugger 6 could be a dedicated debug control module or could be a general purpose computer which is executing debugging software. The debugger 6 and debug control circuitry 22 may communicate over an external input/output pin 32 at the boundary of the system on chip 4. The debug control circuitry 22 and the cluster 8 may communicate over a debug interface 34 which is internal on the system on chip 4 and which is not exposed to the outside of the chip. The debug interface 34 may be relatively long as the distance on chip between the debug control circuitry 22 and the cluster 8 may be relatively great. Hence, communication over the debug interface 34 may be relatively slow.

During debug mode, the debug control circuitry 22 may control the operation of a given core 10 in a number of ways. For example, the debug control circuitry 22 may inject debug instructions which are to be executed by the processor core 10 instead of the regular instructions of the program code being fetched from memory. For example, there may be a separate debug input register to which instructions to be injected can be written by the debug control circuitry 32 under the control of the external debugger 6. The registers 28 of the core 10 may include breakpoint registers 36 for storing breakpoint addresses which represent a program instruction address to be compared with the instruction addresses of the program instruction as being executed, so that when program flow reaches the breakpoint address then the regular program execution can be halted and the core 10 can be switched to the debug mode. For example, at a breakpoint the debug control circuitry 22 may then trigger the execution of the injected debug instructions. Similarly, watchpoint addresses may be stored in watchpoint registers 38 and the addresses of memory accesses initiated by the core may be compared with the watchpoint addresses, so that when a load or store request is made to an address matching the watchpoint address then again the regular code execution can be halted and the core switched to debug mode to trigger further actions by the debug control circuitry 22. The registers may also include other debug control registers 40 for storing status values or control values which influence the way in which debugging is performed.

During the debug mode, the debug control circuitry 22 may also issue messages over the debug interface 34 to trigger the core 10 to respond with the current values of architectural state stored in selected registers 28. The debug control circuitry may then output the current values to the external debugger 6 which can then inspect the architectural state of the core to make deductions about the way in which the previous program execution was functioning to check whether the code is operating correctly.

In some systems the system on-chip may also include trace modules which may operate during the non-debug mode to capture data about the program execution, such as information which would enable a cycle by cycle reconstruction of the sequence of instructions that was executed by the code and/or sequence of data addresses which were accessed for example. While such a trace module may monitor the operation during non-debug mode, the provision of the debug control circuitry 22 may control specific actions to be triggered at a certain point in the program code to inspect register state at a given moment of program execution or trigger additional actions that are not part of the debugged code itself.

Figure 3:
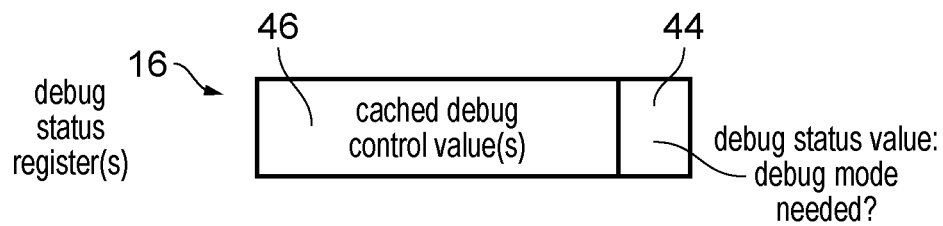
FIG. 3 shows a debug status storage element for storing a debug status value.

FIG. 3 shows the debug status storage element 16 in more detail. The debug status storage element may comprise one or more registers which are shared between the different processor cores 10 of the cluster 8. The debug status store element may store a debug status value 44 which provides an indication of whether a given processor core 10 of the cluster should operate in a debug mode when it first powers up. The debug status value may be set to one of a first value and a second value. When the debug status value 44 has the first value then this may indicate that the debug mode may potentially be needed, while the second value may indicate that the debug mode is not needed. For example, the first value could be 0 and the second value could be 1, or vice versa. In addition to the debug status value, the debug status storage element may also in some examples include one or more cached debug control values 46 which may be values to be written to one or more of the debug control registers 36, 38, 40.

Figure 4:
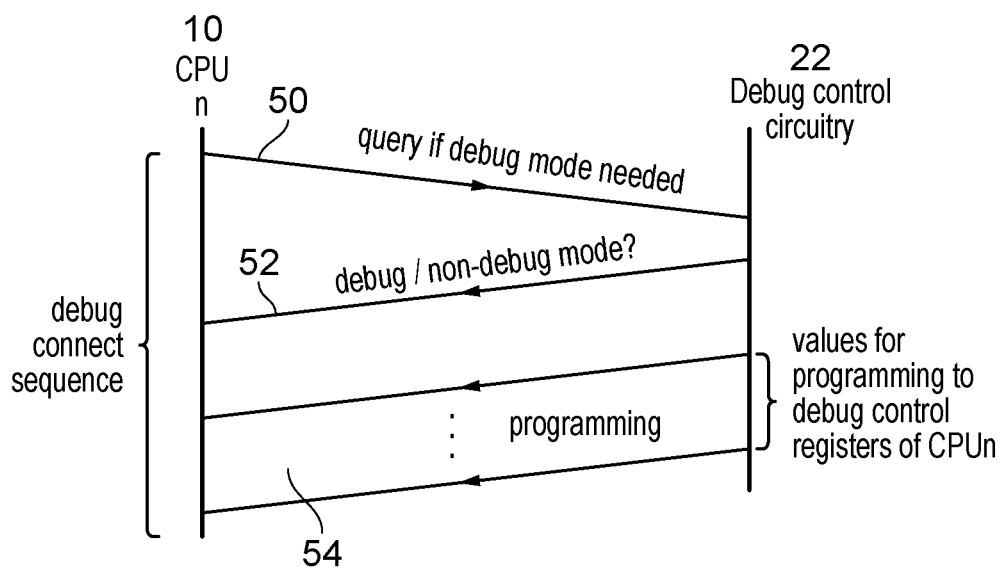
FIG. 4 shows an example of a debug connect sequence.

FIG. 4 shows an example of a debug connect sequence which may be initiated by a given processor core 10 when it is powered up. The debug connect sequence comprises an exchange of messages between the processor core 10 and the debug control circuitry 22 for checking whether the core should operate in the debug mode following the power up and for allowing the debug control circuitry 22 to program some of the debug control registers 36, 38, 40 with any values needed for controlling debugging, such as setting breakpoints or watchpoints. For example the debug connect sequence could include an initial query message 50 sent over the debug interface 34, which could trigger the debug control circuitry 22 to respond with a response message 52 indicating whether debug or non-debug mode is required, and if necessary one or more programming messages 54 for providing the values to be programmed to the registers 36,38,40 of the cluster 8. The debug control circuitry 22 may signal to the core 10 when the programming sequence is finished, either by using a dedicated message, or by including a "programming complete" indication in the last of the programming messages 54, to indicate to the CPU that it can continue processing.

In some examples, the debug mode response message 52 could be omitted. For example the debug power domain 20 could be powered down in all cases where debug mode is not required, for example when the system on-chip has been integrated into the end device and provided to the end user and no further debugging is needed. Hence in some cases, the core 10 could assume that if no response to the query 50 is received within a given time period, then it could be assumed that the debug power domain 20 is powered down so there is no need to operate in debug mode. Regardless of whether such a response message 52 is provided, it may take a number of cycles to perform the debug connect sequence as messages may take a number of processing cycles to pass over the debug interface 34 and the core may need to wait for a certain number of cycles before it can assume that the debug control circuitry is powered down. Such a delay may be incurred not only in the cases where the debug mode is required, but also on each power up in cases when debug mode is not required, which may affect performance in the end device even once all the software development is completed and no further debugging is needed, which can affect the end user (not just the person doing debugging).

In the method described below, the debug status value 44 in the debug status register 16 enables a previous determination of whether the debug mode is required to be cached locally at the cluster 8, so that on subsequent power ups of processor cores the core can quickly detect from the debug status register whether debug mode may be needed, and in cases where it is previously been determined that the core can operate in the non-debug mode then the debug connect sequence shown in FIG. 4 can be omitted. Similarly, if the cluster control logic 14 is powered up before any of the cores 10 have been powered up, the cluster control logic 14 could trigger a similar query message 50 to check whether debug mode is needed and set the debug status value accordingly so that on subsequent processor core power ups the debug connect sequence can be omitted to improve performance.

Hence, in summary cores during booting up may check the debug controller 22 to decide whether they need to enter in debug mode. The technique discussed above can transparently detect the presence of the debug controller to speed up the booting up by reusing the debug interface 34.

Cores communicate with the debug controller during boot time to determine if they need to enter in debug mode or proceed in normal execution mode. This process may involve a sequence of events communicating basic debug information from the debug controller to the core, called a debug connect sequence. Completing the debug connect sequence may require a significant number of cycles, even in the case when entering in debug mode is not needed. Therefore, the debug connect sequence may have a significant impact on boot time performance of the core, especially in systems where cores can be powered up and down a considerable number of times.

The mechanism presented here avoids needing to provide an externally exposed pin for signalling whether debug mode is required, by reusing the debug interface 34 (internal interface communicating between the cores 10 and the debug controller 22) to detect the presence of the external debugger. The debug status storage element 16 (and associated logic within the cluster 8) may intercept the responses provided by the debug control circuitry 22 during the debug connect sequence. If the response indicates that there is an error (or no response is received), the debug controller 22 is not powered up and so it can be deduced that the debug mode is not needed. The debug status storage element 16 records this response into a shared register visible to the cores 10 of the cluster 8. Otherwise, if there is a valid response, the debug status storage element 16 records that the debug mode is needed. Therefore, all cores when powering up can check the content of the shared register 16 to avoid starting the debug connect sequence if debug mode is not needed. Note that debug mode on may be the default value for the debug status storage element 16, so the first core executing the debug connect sequence may be in charge of updating the shared storage element 16 if the debug mode is detected not to be required.

To avoid additional latency on the power up of the first core 10 of the cluster 8, cluster control logic 14 could make a request at cluster power up to the debug controller 22 to obtain the current status and record that in the debug status storage element 16 before any of the cores 10 are powered up.

When enabling debug mode, the debug controller 22 updates the shared debug status storage element 16 on power up to inform all cores 10 that debug mode may be required. Again, the debug to core interface 34 may be reused to send a request to the debug status storage element 16 that the shared register should be updated. Reusing the debug interface 34 allows the number of wires to be reduced compared to provision of the dedicated external pin and avoids complicated wiring up of the system of chip by the system integrator when integrating the chip into a larger electronic device.

Figure 5:
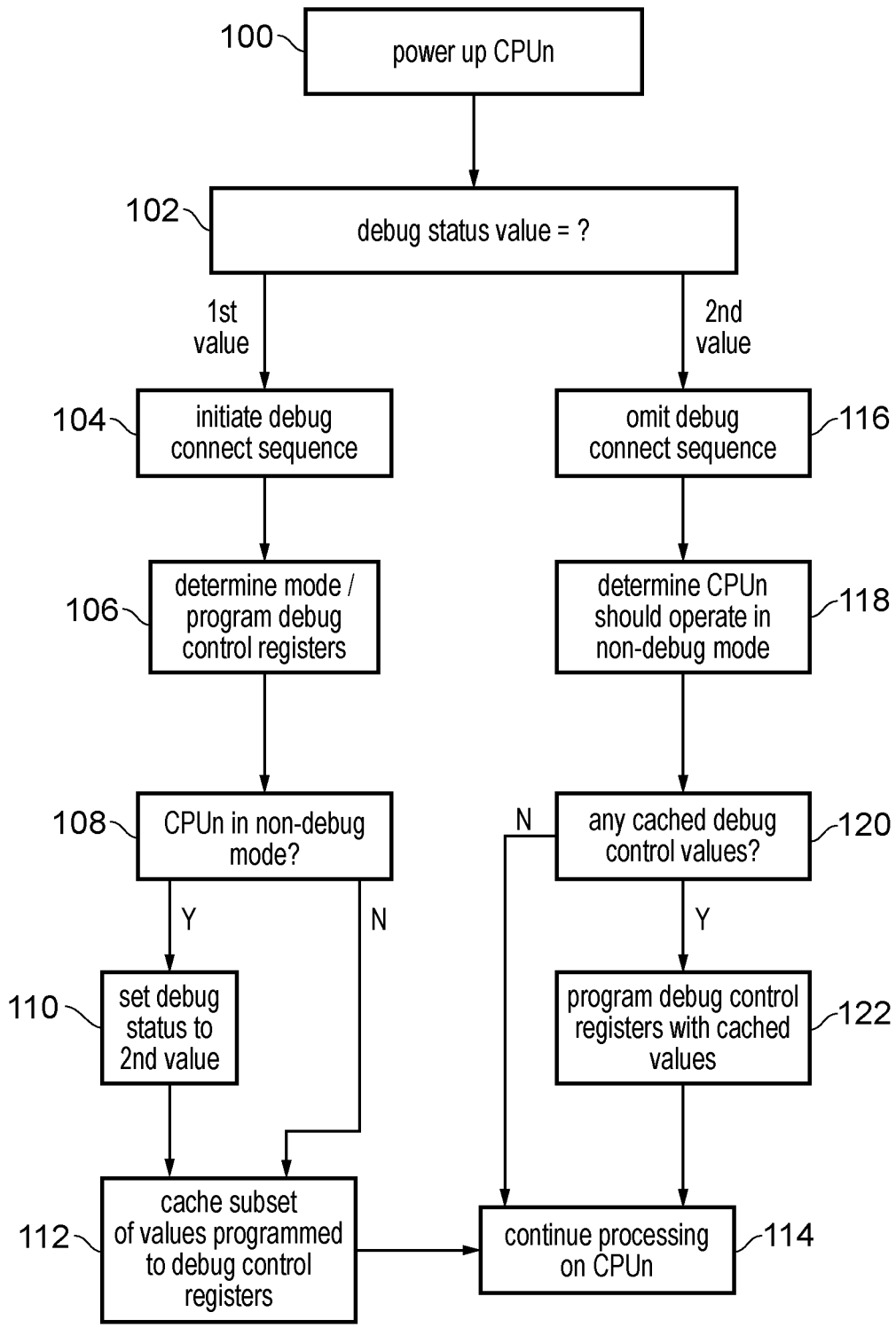
FIG. 5 is a flow diagram showing a method for determining whether the debug connect sequence is required.

FIG. 5 shows a flow diagram showing a method for checking the debug status value and determining whether to operate in debug or non-debug mode. At step 100 a given processor core 10 in the cluster 8 is powered up after previously having been in a power saving state. At step 102 the core 10 checks whether the debug status value 44 in the debug status storage element 16 has a first value or a second value. If the debug status value has a first value then at step 104 the debug connect sequence is initiated, and based on whether any response is received from the debug control circuitry 22, the processor core determines at step 106 whether it should operate in the debug mode or the non-debug mode. In cases where a response is received from the debug response circuitry 22 then the debug control circuitry may program some of the debug control registers 36, 38, 40 with values for controlling debugging. This programming could be done in some implementations only if the core is to operate in the debug mode. Alternatively, in other implementations the debug control circuitry 22 could provide a response specifying that the core should initially operate in non-debug mode but may nevertheless program some breakpoints or watchpoints so that the core can then switch to debug mode when a certain instruction address or data access address is encountered.

At step 108 it is determined whether the core is to operate in the non-debug mode and if so then at step 110 the debug status value 44 is updated to set it to the second value, to indicate that on future occasions of powering up processor cores in the cluster 8 it is not necessary to repeat the debug connect sequence. Step 110 is omitted if the given processor core was determined to operate in the debug mode.

At step 112, a subset of any values programmed to the debug control registers 36, 38, 40 by the debug control circuitry 22 may be cached as cached values 46 in the debug status storage element 16. Step 112 can be performed if the core is to operate either in debug mode or non-debug mode. Step 112 is optional and could be omitted, for example if no debug control values were programmed by the control circuitry 22, or in some implementations the caching of debug control values may not be supported. At step 114, processing then continues following the power up of the given processor core.

If at step 102 it was found that the debug status value 44 had the second value, then at step 116 the debug connect sequence is omitted. This means that the processor core can be powered up and booted faster as it does not need to wait for a number of cycles associated with performing the debug connect sequence. At step 118 the processor core 10 determines that it should operate in the non-debug mode, without performing the debug connect sequence. At step 120 it is determined whether there are any cached debug control values 46 in the debug status register and if so at step 122 the debug control registers 36, 38, 40 are programmed with the cached values. If there are no cached debug control values 46 then step 122 is omitted. Either way at step 114 processing now continues on the processor core 10.

Figure 6:
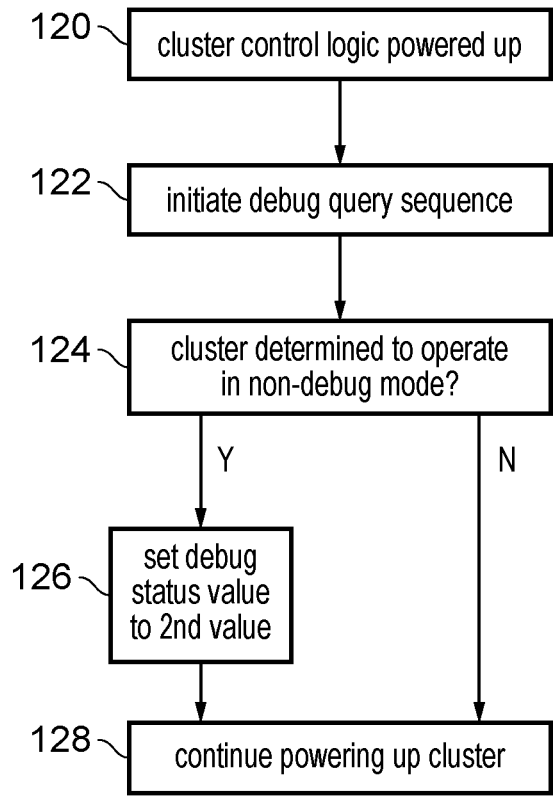
FIG. 6 is a flow diagram showing a method of initiating a debug query sequence when cluster control logic is powered up.

FIG. 6 shows a method where the cluster control logic 14 can initiate a query of whether debug or non-debug mode is required. The cluster control logic is powered up at step 120. This may take place before any of the individual processor cores 10 of the cluster are powered up, as the control logic 14 may need to perform some actions for controlling the way in which the cores are powered or may need to initialise control data for the cores. At step 122, as part of its power up routine the cluster control logic 14 initiates a debug query sequence, over the debug interface 34 to check with the debug control circuitry 22 whether the cluster should operate in non-debug mode, or debug mode. Based on the debug query sequence, at step 124 the cluster control logic 14 determines whether the cluster should operate in the non-debug mode, and if so then at step 126 the debug status value 44 in the data debug storage element 16 is set to the second value. Step 126 is omitted if the debug query sequence determines that the cluster should operate in the debug mode. Regardless of whether the cluster should operate in the debug mode or non-debug mode, at step 128 the cluster control logic 14 continues powering up the cluster 8. When some of the processor cores 10 are later powered up, they may check the debug status value and check whether the debug connect sequence is needed. The debug query sequence 122 may be similar to the debug connect sequence but need not include all parts of the debug connect sequence. For example the messages for programming the control registers of a given processor core may be omitted from the debug query sequence.

Figure 7:
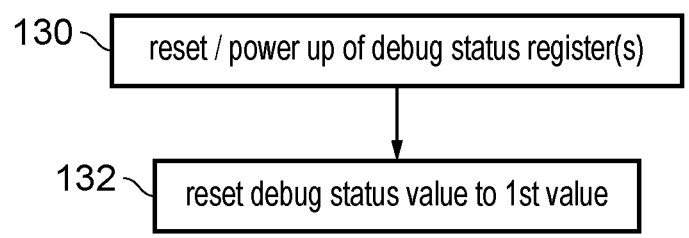
FIG. 7 shows a method of triggering a reset of the debug status value in response to resetting or powering down the debug status storage element.

FIG. 7 shows a flow diagram illustrating resetting of the debug status value. The debug status register 16 may have a reset input for receiving a reset signal which may be asserted to trigger the system on-chip 4 to reset to some known state. Also sometimes the debug status storage element 16 may be powered down, for example when the cluster power domain 18 is powered down. As shown in FIG. 7, when a reset or a power up of the debug status registers 16 occurs at step 130, then in response at step 132 the debug status value 44 may be reset to the first value. By defaulting to the first value, this ensures that the first time the cluster control logic 14 or a processor core 10 is powered up after the reset or the power up of the debug status register, the debug connect sequence or debug query sequence would be initiated, to allow a determination of whether the cluster 8 should function in the debug mode or the non-debug mode.

Figure 8:
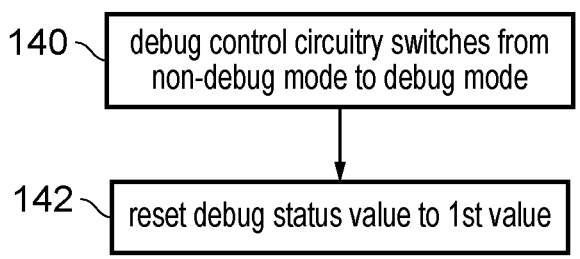
FIG. 8 shows a method of resetting the debug status value in response to a signal from the debug control circuitry.

Sometimes it is possible that the status of whether the cluster 8 should operate in debug mode or non-debug mode may change once the cluster 8 is already powered up (e.g. if the external debugger 6 activates the debug controller 22 while core 10 is running). In this case, the debug control circuitry 22 may transmit a message on the debug interface 34 to trigger the debug status value 44 to switch back to the first value, so that any subsequent core power ups will then lead to the debug connect sequence being performed with the debug control circuitry 22, to ensure debugging can be performed as required by the external debugger 6. Hence, as shown in FIG. 8, if at step 140 the debug control circuitry 22 switches from a non-debug mode to a debug mode, then in response at step 142 the debug control circuitry 22 triggers a message on the debug interface 34 to reset the debug status value 44 to the first value which indicates that the debug connect sequence should be performed in future.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An apparatus comprising:
   at least one processor core having a debug mode of operation and a non-debug mode of operation;
   debug control circuitry to control operation of the at least one processor core when the at least one processor core is operating in the debug mode;
   a debug interface to exchange messages between the debug control circuitry and the at least one processor core; and
   a debug status storage element to store a debug status value, in which:
   on power up of a given processor core, the given processor core is configured to check the debug status value stored in the debug status storage element;
      when the debug status value has a first value, the given processor core is configured to initiate a debug connect sequence of messages exchanged with the debug control circuitry over the debug interface to:
         determine whether the given processor core should operate in the debug mode or the non-debug mode, and
         trigger setting of the debug status value in the debug status storage element to a second value when it is determined that the given processor core should operate in the non-debug mode; and
      when the debug status value has the second value, the given processor core is configured to omit initiating the debug connect sequence and determine that the given processor core should operate in the non-debug mode.

2. The apparatus according to claim 1, in which the debug status storage element is capable of remaining powered up even when each of said at least one processor core is in a power saving state.

3. The apparatus according to claim 1, comprising a cluster of at least two processor cores each having the debug mode of operation and the non-debug mode of operation.

4. The apparatus according to claim 3, in which the debug status storage element is shared between said at least two processor cores.

5. The apparatus according to claim 4, in which when a second processor core of the cluster is powered up after a first processor core has already initiated the debug connect sequence, the second processor core is configured to omit initiating the debug connect sequence when the debug connect sequence initiated by the first processor core triggered setting of the debug status value to the second value.

6. The apparatus according to claim 3, comprising cluster control circuitry associated with the cluster, where the cluster control circuitry is capable of being powered up even when each of said at least two processor cores is in a power saving state.

7. The apparatus according to claim 6, in which on power up of the cluster control circuitry, the cluster control circuitry is configured to initiate a debug query sequence of messages exchanged with the debug control circuitry over the debug interface to:
   determine whether the cluster should operate in the debug mode or the non-debug mode, and
   trigger setting of the debug status value in the debug status storage element to a second value when it is determined that the cluster should operate in the non-debug mode.

8. The apparatus according to claim 7, in which the cluster control circuitry is configured to initiate the debug query sequence before any of said at least two processor cores are powered up.

9. The apparatus according to claim 1, in which on a switch from non-debug mode to debug mode, the debug control circuitry is configured to issue a status update message over the debug interface, to trigger the debug status value in the debug status storage element to be set to the first value.

10. The apparatus according to claim 1, in which in response to a power up or reset of the debug status storage element, the debug status storage element is configured to set the debug status value to the first value.

11. The apparatus according to claim 1, in which in the debug mode, the debug control circuitry is configured to perform at least one of:
   supply debug instructions to be executed by the at least one processor core during the debug mode; and
   inspect architectural state or micro-architectural state stored in at least one register of the at least one processor core.

12. The apparatus according to claim 1, in which each processor core comprises at least one debug control register to store at least one debug control value programmable by the debug control circuitry; and
   in the debug connect sequence, the debug control circuitry is configured to send at least one message for programming the at least one debug control value in said at least one debug control register of the given processor core.

13. The apparatus according to claim 12, in which the at least one debug control register comprises at least one of:
   at least one breakpoint register to store at least one breakpoint address, wherein the given processor core is configured to switch to the debug mode in response to detecting program flow reaching said at least one breakpoint address; and
   at least one watchpoint register to store at least one watchpoint address, wherein the given processor core is configured to switch to the debug mode in response to detecting a data access to said at least one watchpoint address.

14. The apparatus according to claim 12, in which when the debug connect sequence is initiated for the given processor core, the debug status storage element is configured to cache at least a subset of said at least one debug control value provided by the debug control circuitry for programming to the at least one debug control register of the given processor core.

15. The apparatus according to claim 14, in which when the debug status value has the second value and the debug status storage element stores at least one cached debug control value, the given processor core is configured to program at least a subset of said at least one debug control register based on said at least one cached debug control value stored in the debug status storage element.

16. The apparatus according to claim 1, in which the debug control circuitry is configured to operate in a different power domain to the at least one processor core.

17. The apparatus according to claim 1, in which the debug control circuitry is configured to operate under control of an external debugger external to said apparatus.

18. A system comprising:
the apparatus of claim 1; and
an external debugger to control operation of the debug control circuitry.

19. An apparatus comprising:
at least one means for data processing having a debug mode of operation and a non-debug mode of operation;
means for controlling operation of the at least one means for data processing when the at least one processor core is operating in the debug mode;
means for exchanging messages between the means for controlling and the at least one means for data processing; and
means for storing a debug status value, in which:
on power up of a given means for data processing, the given means for data processing is configured to check the debug status value stored in the means for storing;
when the debug status value has a first value, the given means for data processing is configured to initiate a debug connect sequence of messages exchanged with the means for controlling over the means for exchanging messages to:
determine whether the given means for data processing should operate in the debug mode or the non-debug mode, and
trigger setting of the debug status value in the means for storing to a second value when it is determined that the given means for data processing should operate in the non-debug mode; and
when the debug status value has the second value, the given means for data processing is configured to omit initiating the debug connect sequence and determine that the given means for data processing should operate in the non-debug mode.

20. A data processing method for an apparatus comprising at least one processor core having a debug mode of operation and a non-debug mode of operation, debug control circuitry to control operation of the at least one processor core when the at least one processor core is operating in the debug mode, and a debug interface to exchange messages between the debug control circuitry and the at least one processor core;
the method comprising:
on power up of a given processor core, the given processor core checking a debug status value stored in a debug status storage element;
when the debug status value has a first value, the given processor core initiating a debug connect sequence of messages exchanged with the debug control circuitry over the debug interface to:
determine whether the given processor core should operate in the debug mode or the non-debug mode, and
trigger setting the debug status value in the debug status storage element to a second value when it is determined that the given processor core should operate in the non-debug mode; and
when the debug status value has the second value, the given processor core omitting initiating the debug connect sequence, and determining that the given processor core should operate in the non-debug mode.

* * * * *